(12) United States Patent
Sadygov et al.

(10) Patent No.: US 9,252,317 B2
(45) Date of Patent: Feb. 2, 2016

(54) MULTI-PIXEL AVALANCHE TRANSISTOR

(71) Applicant: Zecotek Photonics Inc., Richmond (CA)

(72) Inventors: Ziraddin Yegub-Ogly Sadygov, Dubna (RU); Azar Sadygov, Baku (AZ)

(73) Assignee: ZECOTEK PHOTONICS INC., Richmond (CA)

( * ) Notice: Subject to any disclaimer, the term of this patent is extended or adjusted under 35 U.S.C. 154(b) by 0 days.

(21) Appl. No.: 14/459,136

(22) Filed: Aug. 13, 2014

(65) Prior Publication Data
US 2015/0048472 A1 Feb. 19, 2015

Related U.S. Application Data

(60) Provisional application No. 61/865,503, filed on Aug. 13, 2013.

(51) Int. Cl.
| | | |
|---|---|---|
| H01L 31/107 | (2006.01) | |
| H01L 27/146 | (2006.01) | |
| H01L 31/08 | (2006.01) | |
| H01L 31/115 | (2006.01) | |
| H01L 27/144 | (2006.01) | |

(52) U.S. Cl.
CPC .......... *H01L 31/107* (2013.01); *H01L 27/1446* (2013.01); *H01L 27/14643* (2013.01); *H01L 31/085* (2013.01); *H01L 31/115* (2013.01)

(58) Field of Classification Search
CPC .......................... H01L 27/1446; H01L 31/107
See application file for complete search history.

(56) References Cited

U.S. PATENT DOCUMENTS

| | | | | |
|---|---|---|---|---|
| 3,925,658 | A * | 12/1975 | Connors | 257/443 |
| 7,592,576 | B1 * | 9/2009 | Hayashi et al. | 250/208.1 |
| 2012/0068050 | A1 | 3/2012 | Mazzillo et al. | |
| 2013/0099100 | A1 | 4/2013 | Pavlov | |

FOREIGN PATENT DOCUMENTS

| | | |
|---|---|---|
| RU | 2102820 C1 | 1/1998 |
| WO | WO 2012/057082 A1 | 5/2012 |

OTHER PUBLICATIONS

International Search Report, Application No. PCT/IB2014/002025, Apr. 23, 2015.

* cited by examiner

*Primary Examiner* — Erik Kielin
(74) *Attorney, Agent, or Firm* — Davis Wright Tremaine LLP

(57) ABSTRACT

Semiconductor avalanche photo transistors and methods of manufacturing the same, operable for internal amplification of a photo signal and for use in detection of weak light signals, gamma rays and nuclear particles. The multi-pixel avalanche photo transistor devices can comprise a semiconductor layer, a plurality of semiconductor areas (pixels) forming a p-n-junction with the semiconductor layer, a common conductive grid separated from the semiconductor layer by a dielectric layer and individual micro-resistors connected to said semiconductor areas with the common conductive grid. Systems and methods described can be operable to decrease optical crosstalk at high signal amplification and the special capacity of the multi-pixel avalanche photo transistor, as well as improve speed of its photo response.

13 Claims, 1 Drawing Sheet

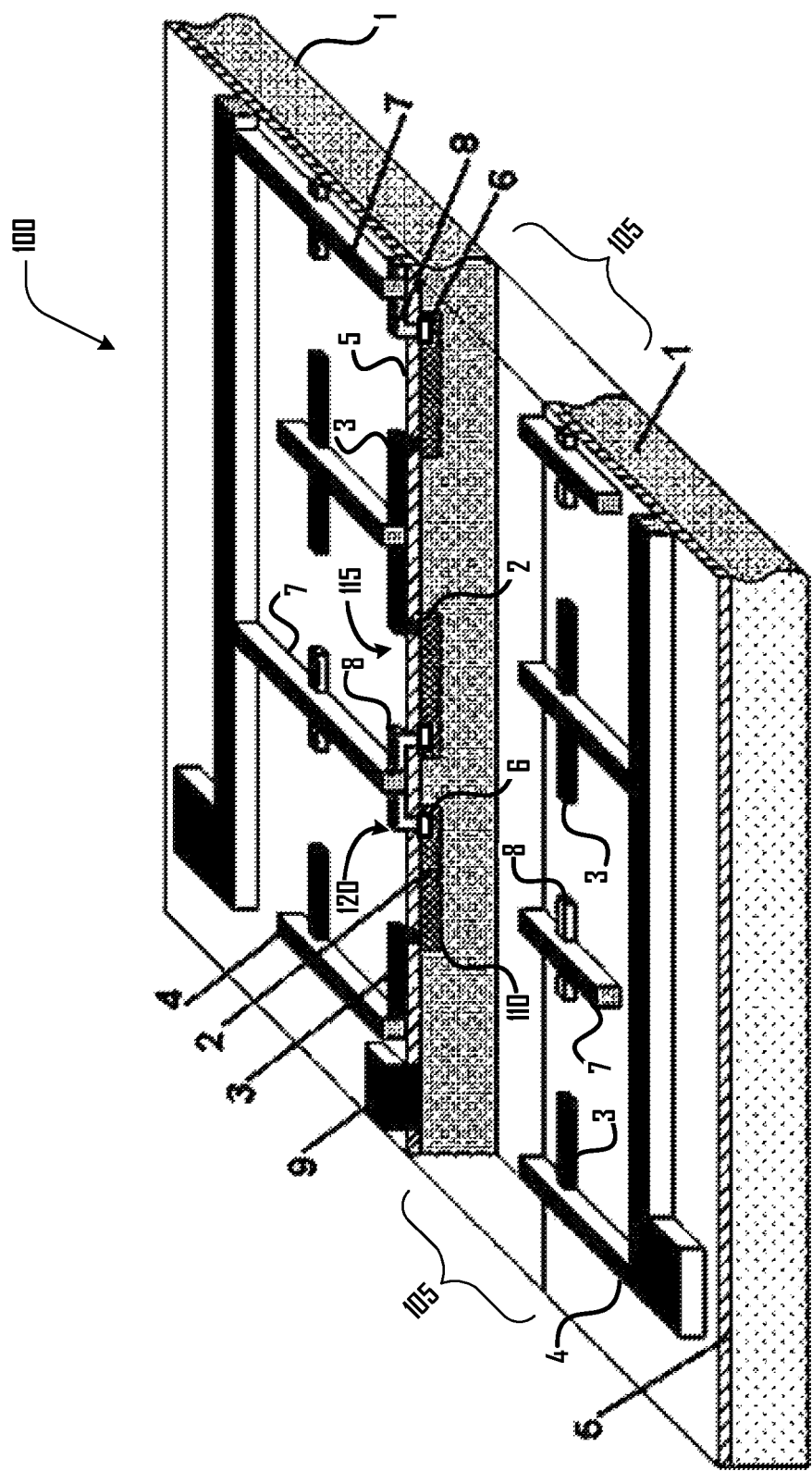

MULTI-PIXEL AVALANCHE TRANSISTOR

CROSS-REFERENCE TO RELATED APPLICATIONS

This application claims the benefit of U.S. Provisional Application No. 61/865,503 filed Aug. 13, 2013, which application is hereby incorporated herein by reference in its entirety for all purposes.

FIELD

The disclosure is related to semiconductor devices, more specifically, to semiconductor avalanche photo transistors with internal amplification of a photo signal.

BACKGROUND

Photosensitive semiconductor devices are used in many scientific and household devices for detection and processing of optical information. The key element of such devices is a photodiode that converts optical information into an electric signal. Photo-sensitivity and fast response time are basic working parameters of the photodiode. Conventionally, vacuum photo multipliers are used in such optical devices. However, semiconductor photoelectron multipliers or multi-pixel avalanche photodiodes (MAPD) (also named as multi-pixel photon counters (MPPC) or silicon photomultipliers (SiPM)) have also been developed which are an alternative to vacuum photoelectron multipliers.

For example, Russian patent 1702831 teaches a silicon substrate surface on which a matrix of small independent p-n-junctions (pixels) is formed. The residual surface of the substrate is filled by a dielectric layer (silicon dioxide). On the surface of both the pixels and the dielectric layer is formed a thin resistive layer of about $10^7$ Ohm-cm resistivity and a semitransparent metal layer (field electrode). Avalanche amplification of photoelectrons is carried out in small dependent p-n-junctions (pixels). The avalanche current flows to the field electrode through the resistive layer fully covering the sensitive surface of pixels. However, this device is deficient because it provides low quantum efficiency in the visible spectrum because of low transparency of both the resistive layer and the field electrode.

U.S. Pat. No. 5,844,291 teaches a silicon substrate surface of n-type conductivity on which a resistive layer is disposed that comprises silicon carbide with certain resistivity, a dielectric layer, and an epitaxial silicon layer of p-type conductivity. Inside the dielectric layer, highly doped areas of n-type conductivity are formed having an electric contact with the resistive layer from one side, and with the epitaxial layer from another side. The photosensitive layer, in which photoelectrons are created, is an epitaxial layer grown on the surface of alien materials (i.e., dielectric and resistive layers). This device is also deficient because of the complexity of growing a silicon epitaxial layer on a dielectric surface.

Russian patent 2102820 teaches an MAPD device that comprises an array of small size p-n junctions (pixels) with characteristic sizes from 10 μm up to 100 μm formed on a semiconductor layer surface. The pixels are arranged at a certain spacing (about 10 μm) that is necessary to prevent charge coupling. Each pixel is connected to a common conductive grid by an individual micro resistor with a resistance of $10^5$-$10^6$Ω. Due to low sizes of pixels, the MAPD may perform at overvoltage mode (i.e., above the breakdown potential). Then, the generation of a photoelectron (or a dark electron) in the sensitive region of a pixel the self-quenching avalanche process starts. This process is an analogous to the Geiger mode discharge.

The avalanche process is quenched when the potential on the pixel drops below the breakdown voltage due to the individual micro-resistor, which does not allow the pixel to be charged from the voltage source during the avalanche process. As a result, the unique combination of fast photo response (i.e., width of a pulse at half height of the amplitude which is about 10 ns) and high avalanche amplification of a signal (~$10^6$) is achieved. The signals from operating pixels are added on the common conductive grid, which provides linearity of the MAPD photo response. The response remains linear as far as the probability for two or more photons to strike one pixel is insignificant.

However, some applied tasks need MAPD devices with faster photo response (about 1 ns) and larger sensitive area (at least 10 mm$^2$ or more). Increasing the sensitive area leads to stretching its photo response because of high special capacity of the known MAPD devices. Additionally, high amplification of a photo signal in the known MAPD devices results in an undesirable effect—optical crosstalk. This effect is connected with high avalanche amplification (~$10^6$) photo signals which are accompanied by additional emission of optical photons in avalanche region of the semiconductor. These photons are absorbed in the neighbor pixels of the MAPD device and cause false start of the avalanche process. In order to avoid the crosstalk effect, the avalanche amplification factor should be reduced below $10^5$, but this low amplification factor is not enough for work in single photoelectron detection mode.

In view of the foregoing, a need exists for an improved multi-pixel avalanche photodiode (MAPD) systems and methods in an effort to overcome the aforementioned obstacles and deficiencies of conventional photosensitive semiconductor systems.

BRIEF DESCRIPTION OF THE DRAWINGS

FIG. 1 illustrates a perspective view of a multi-pixel avalanche photo transistor (MAPT) device, with a portion removed to show a cross-section of the MAPT device.

It should be noted that the figures are not drawn to scale and that elements of similar structures or functions are generally represented by like reference numerals for illustrative purposes throughout the FIGURES. It also should be noted that the figures are only intended to facilitate the description of the preferred embodiments. The FIGURES do not illustrate every aspect of the described embodiments and do not limit the scope of the present disclosure.

DETAILED DESCRIPTION OF THE PREFERRED EMBODIMENTS

Since currently-available systems are deficient, a multi-pixel avalanche photo transistor for detection of weak light signals, gamma rays and nuclear particles can prove desirable and provide a basis for a wide range of benefits, such as decreased optical crosstalk at high signal amplification (about $10^6$ or more), decreased special capacitance, and improved photo response speed. This result can be achieved, according to one embodiment disclosed herein, by a disclosed multi-pixel avalanche photo transistor (MAPT) 100 as illustrated in FIG. 1.

FIG. 1 illustrates a perspective view of the MAPT device 100, with a portion 105 removed to show a cross-section of the MAPT device 100. The MAPT device 100 comprises a substantially planar semiconductor layer 1 that includes a plurality of semiconductor areas 2 disposed in slots 110 defined by the semiconductor layer 1. For example, in some embodiments, and as depicted in FIG. 1, the slots 110 and semiconductor areas 2 can be substantially rectangular and elongated, having a thickness that is even with a top surface of the semiconductor layer 1. The semiconductor areas 2 and semiconductor layer 1 define respective p-n-junctions 115.

A substantially planar dielectric layer 5 can be disposed over the semiconductor layer 1 and semiconductor areas 2. Each semiconductor area 2 can include a first micro-resistor 3 that extends through the dielectric layer 5 to connect the semiconductor area 2 with a conductive grid 4. Micro-resistors 3 and the common conductive grid 4 can extend along a top surface of the dielectric layer 5, which may substantially isolate the micro-resistors 3 and the common conductive grid 4 from the semiconductor area 2 aside from the portion of micro-resistors 3 that extends through the dielectric layer 5 and contacts the semiconductor area 2.

Additionally, an emitter 6 can be disposed on a portion of the semiconductor area 2, and operably connected to a conductive grid 7 by a second micro-resistor 8 that extends through the dielectric layer 5. Micro-resistors 8 and the conductive grid 7 can extend along a top surface of the dielectric layer 5, which may substantially isolate the micro-resistors 8 and the conductive grid 7 from the semiconductor area 2 aside from the portion of the micro-resistors 8 that extends through the dielectric layer 5 and contacts the semiconductor area 2.

Additionally the MAPT device 100 can include a contact area 9 that is operable to apply bias to the semiconductor layer 1. For example, the contact area 9 can extend through the dielectric layer 5 and contact the semiconductor layer 1.

In various embodiments, the semiconductor layer 1 can comprise a uniform semiconductor plate (substrate) defined by an epitaxial semiconductor layer grown on semiconductor or dielectric substrates with a desired diameter and thickness. The example structures and configuration the MAPT device 100 depicted in FIG. 1 may be grown, built or otherwise created in any suitable manner including photolithography.

In some embodiments, emitters 6 can comprise the same material as the semiconductor areas 2, but have the opposite type of conductivity. In other words, potential barriers between individual emitters 6 and semiconductor areas 2 can define homogeneous p-n-junctions.

In further embodiments, individual emitters 6 can comprise a wide-bandgap semiconductor in relation to semiconductor areas 2. In other words, potential barriers between individual emitters 6 and semiconductor areas 2 can define heterogeneous p-n-junctions 115.

In other embodiments, individual emitters 6 can comprise a suitable metal material. In other words, Shottky barriers can be formed between individual emitters 6 and semiconductor areas 2.

In an operating mode of the MAPT device 100, in accordance with some embodiments, negative bias can be applied to the semiconductor layer 1 relative to the both the common conductive grid 4 and the additional conductive grid 7. In embodiments having small sizes, semiconductor areas 2 (or pixels) can work in Geiger mode at which the bias may exceed the characteristic breakdown voltage by $\Delta U = 2V$. Geiger mode avalanche process can be initiated by the presence of single photoelectron in a pixel 2, and this results in increasing potential drop on the individual micro-resistor 3 and/or 8 up to $\Delta U = 2V$. At the same time, potential of the pixel 2 is decreased by the same value.

The potential drop $\Delta V \sim 2B$ can completely open a potential barrier between the semiconductor area 2 and the individual emitter 6. In some embodiments, this can be as a result of high current flow through the individual emitter 6. Pulsed current can be limited by the additional individual micro-resistor 3 and/or 8. Pulsed current can be switched off when potential of the pixel 2 reaches previous value by means of charging via the individual micro-resistor 3 and/or 8.

Accordingly, photo-signal in the MAPT device 100 is amplified again in a micro-transistor 120 (i.e., in a structure comprising by the "individual emitter 6-semiconductor area 2-semiconductor layer 1"). The amplified signal is detected on an external load resistance connected to an electric circuit of the additional conductive grid 7. Full value of amplification factor of the signal is defined as $M_0 = M_{av} * M_{tr}$, where $M_{av}$—amplification factor of avalanche process, $M_{tr}$—amplification factor of the micro-transistor 120.

Thus, necessary high amplification factor (for example, $M_0 = 10^6$) of the photo signal is received having low avalanche amplification factor (for example, $M_{av} = 10^5$) at which the crosstalk is very low in some embodiments. Here the individual micro-transistor 120 provides amplification factor $M_{tr} = 10$. Rise-time of the photo signal can be improved due to low capacitance micro-transistors 120. For example, in one embodiment, pixels 2 can be of 50 μm×50 μm, and the sizes of micro-transistors 120 do not exceed 5 μm×5 μm.

In some embodiments the multi-pixel avalanche detector 100 can be fabricated as follows. On a surface of a semiconductor layer 1, (e.g., a silicon layer of n-type conductivity with specific resistance 2Ω×cm) a dielectric layer 5 of silicon dioxide ($SiO_2$) having about 0.1 μm thickness can be formed by thermal oxidation at temperature 1100° C. Windows having a size of 40 μm×40 μm with spacing of 10 μm can be opened in the silicon dioxide dielectric layer 5 using photolithography. The open window areas can be doped with boron ions with a dose of $0.6 \times 10^{14}$ ions/cm² and energy 70 keV to form p-type semiconductor areas (i.e., pixels 2 of p-n-junctions 115). In some embodiments, an emitter 6 can be formed by doping a small part of each pixel 2. For example, about 5 μm×5 μm area, can be doped with phosphorous ions having dose of $9 \times 10^{14}$ ions/cm² and energy 100 keV. A contact area to pixel 2 (i.e., to the p-type silicon area) can formed by additional doping of a portion of the pixel 2 by boron ions having dose $3 \times 10^{14}$ ions/cm² and energy 70 keV. Micro-resistors 3 and/or 8, can comprise amorphous silicon with resistance about 20 kΩ/square and can be produced using chemical deposition from a gas phase. The both the common conductive grid 4 and the additional conductive grid 7 can be formed by thermal evaporation of metal aluminum.

In various embodiments, such the systems and methods described herein may produce low level optical crosstalk and a fast photo response. Accordingly, MAPT devices 100 described herein can be used in high energy physics, dosimeters, medical positron emitting scanners and other suitable fields.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

What is claimed is:
1. A multi-pixel avalanche photo transistor comprising:
a semiconductor layer;
a plurality of semiconductor areas forming a p-n-junction with said semiconductor layer;

a common conductive grid separated from said semiconductor layer by a dielectric layer; and individual micro-resistors connecting said semiconductor areas with the common conductive grid, distinguished by that on a part of a surface of said semiconductor areas, respective individual emitters form potential barriers with said semiconductor areas, wherein the individual emitters are connected to an additional conductive grid by means of respective second individual micro-resistors.

2. The multi-pixel avalanche photo transistor in accordance with claim 1, wherein said individual emitters are executed of the same material with semiconductor areas, but having opposite type of conductivity.

3. The multi-pixel avalanche photo transistor in accordance with claim 1, wherein said individual emitters are executed of a wide-bandgap semiconductor in relation to said semiconductor areas.

4. The multi-pixel avalanche photo transistor in accordance with claim 1, wherein said individual emitters are executed of a metal material.

5. The multi-pixel avalanche photo transistor in accordance with claim 1, wherein said semiconductor layer is formed on surface of a semiconductor substrate.

6. The multi-pixel avalanche photo transistor in accordance with claim 5, wherein said individual emitters are executed of the same material with semiconductor areas, but having opposite type of conductivity.

7. The multi-pixel avalanche photo transistor in accordance with claim 5, wherein said individual emitters are executed of a wide-bandgap semiconductor in relation to said semiconductor areas.

8. The multi-pixel avalanche photo transistor in accordance with claim 5, wherein said individual emitters are executed of a metal material.

9. The multi-pixel avalanche photo transistor in accordance with claim 1, wherein said semiconductor layer is formed on surface of a dielectric substrate.

10. The multi-pixel avalanche photo transistor in accordance with claim 9, wherein said individual emitters are executed of the same material with semiconductor areas, but having opposite type of conductivity.

11. The multi-pixel avalanche photo transistor in accordance with claim 9, wherein said individual emitters are executed of a wide-bandgap semiconductor in relation to said semiconductor areas.

12. The multi-pixel avalanche photo transistor in accordance with claim 9, wherein said individual emitters are executed of a metal material.

13. A multi-pixel avalanche photo transistor comprising:

a semiconductor layer;

a plurality of semiconductor areas disposed in the semiconductor layer and defining a p-n-junction with the semiconductor layer;

a dielectric layer disposed over a surface defined by the semiconductor layer and the plurality of semiconductor areas;

a common conductive grid disposed on the dielectric layer and separated from the semiconductor layer by the dielectric layer;

a plurality of first micro-resistors extending through the dielectric layer and operably connecting respective semiconductor areas with the common conductive grid; and a plurality of second micro-resistors extending through the dielectric layer and operably connecting respective semiconductor areas with a second conductive grid via respective emitters that are operably connected to respective semiconductor areas, the emitters forming respective potential barriers with respective semiconductor areas.

\* \* \* \* \*